(12) United States Patent
Liou et al.

(10) Patent No.: US 9,373,505 B2
(45) Date of Patent: Jun. 21, 2016

(54) MARK SEGMENTATION METHOD AND METHOD FOR MANUFACTURING A SEMICONDUCTOR STRUCTURE APPLYING THE SAME

(71) Applicant: UNITED MICROELECTRONICS CORP., Hsinchu (TW)

(72) Inventors: En-Chiuan Liou, Tainan (TW); Yu-Ying Huang, Tainan (TW); Jen-Hsiu Li, Tainan (TW); Mei-Chen Chen, Tainan (TW); Ya-Ling Chen, Kaohsiung (TW); Yi-Jing Wang, Tainan (TW); Chi-Ming Huang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 97 days.

(21) Appl. No.: 14/278,296

(22) Filed: May 15, 2014

(65) Prior Publication Data

US 2015/0294058 A1    Oct. 15, 2015

(30) Foreign Application Priority Data

Apr. 15, 2014    (CN) .......................... 2014 1 0150885

(51) Int. Cl.
*H01L 23/544*    (2006.01)
*H01L 21/033*    (2006.01)

(52) U.S. Cl.
CPC .......... *H01L 21/0334* (2013.01); *H01L 23/544* (2013.01); *H01L 21/0337* (2013.01); *H01L 2223/5442* (2013.01); *H01L 2223/54426* (2013.01); *H01L 2223/54453* (2013.01)

(58) Field of Classification Search
CPC ...... H01L 23/544; H01L 23/58; G01B 11/00; G01B 11/14; G01B 11/27
See application file for complete search history.

(56) References Cited

U.S. PATENT DOCUMENTS

| 6,921,916 B2 * | 7/2005 | Adel .................. G03F 7/70633 257/48 |
| 8,400,634 B2 | 3/2013 | Zhou et al. |
| 2009/0225331 A1 | 9/2009 | Van Haren |
| 2013/0052793 A1 | 2/2013 | Shieh et al. |

* cited by examiner

*Primary Examiner* — Kyoung Lee
(74) *Attorney, Agent, or Firm* — WPAT, PC; Justin King (57) ABSTRACT

In this disclosure, a mark segmentation method and a method for manufacturing a semiconductor structure applying the same are provided. The mark segmentation method comprises the following steps. First, a plurality of segments having a width $W_S$ and separated from each other by a space $S_S$ formed on a substrate are identified by a processor. Thereafter, a plurality of marks are set over the segments by the processor. This step comprises: (1) adjusting a width $W_M$ of each one of the marks being equal to $m(W_S+S_S)+W_S$ or $m(W_S+S_S)+S_S$ by the processor, wherein m is an integer; and (2) adjusting a space $S_M$ of adjacent two of the marks by the processor such that $W_M+S_M=n(W_S+S_S)$, wherein n is an integer.

18 Claims, 11 Drawing Sheets

MARK SEGMENTATION METHOD AND METHOD FOR MANUFACTURING A SEMICONDUCTOR STRUCTURE APPLYING THE SAME

This application claims the benefit of People's Republic of China application Serial No. 201410150885.3 filed on Apr. 15, 2014, the disclosure of which is incorporated by reference herein in its entirety.

BACKGROUND

1. Technical Field

The disclosure relates to a mark segmentation method and a method for manufacturing a semiconductor structure applying the same.

2. Description of the Related Art

Generally, semiconductor structures comprise a plurality of layered structure formed in different steps. The layered structure must be aligned to assure the functions of the semiconductor structures. Further, corresponding elements of the semiconductor structures are typically formed on a substrate simultaneously. The corresponding elements must be formed at the same position in the semiconductor structures. To achieve these objects, one approach is using marks for alignment. The marks may be features formed simultaneously with one layer, or formed in an additional step. Alternatively, the marks may comprise some features of a layered structure. Still alternatively, the marks may be defined with the features mentioned above. The features may be configured as crosses or segments. As the reduction of the semiconductor structure sizes, alignment steps become more important, while more difficult to carry out.

SUMMARY

In this disclosure, a mark segmentation method is provided for setting marks using the features. Also, a method for manufacturing a semiconductor structure applying the same is provided.

According to some embodiments, the mark segmentation method comprises the following steps. First, a plurality of segments having a width $W_S$ and separated from each other by a space $S_S$ are identified by a processor. Thereafter, a plurality of marks are set over the segments by the processor. This step comprises: (1) adjusting a width $W_M$ of each one of the marks being equal to $m(W_S+S_S)+W_S$ or $m(W_S+S_S)+S_S$ by the processor, wherein m is an integer; and (2) adjusting a space $S_M$ of adjacent two of the marks by the processor such that $W_M+S_M=n(W_S+S_S)$, wherein n is an integer.

According to some embodiments, the method for manufacturing a semiconductor structure comprises the following steps. First, a plurality of segments having a width $W_S$ and separated from each other by a space $S_S$ are formed on a substrate. Thereafter, a plurality of marks having a width $W_M$ and separated from each other by a space $S_M$ are set over the segments by the processor. $W_M$ equals to $m(W_S+S_S)+W_S$ or $m(W_S+S_S)+S_S$, wherein m is an integer. $W_M+S_M$ equals to $n(W_S+S_S)$, wherein n is an integer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
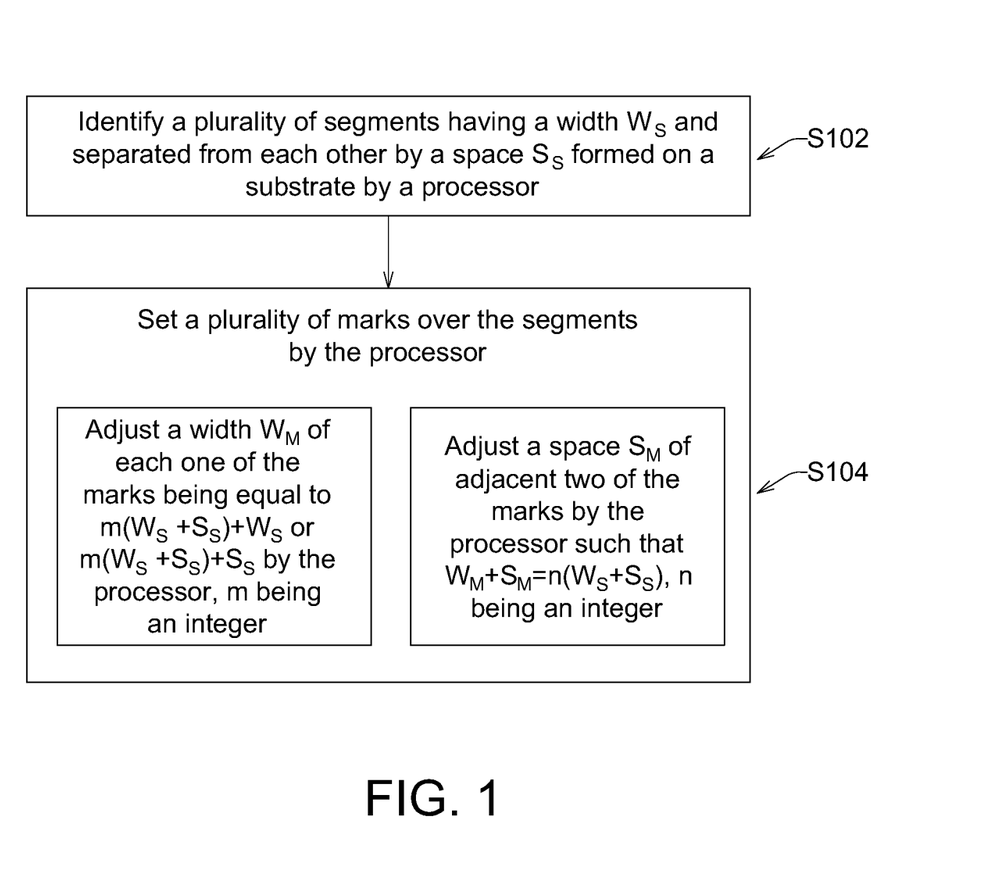
FIG. 1 shows a flow chart of the mark segmentation method according to one embodiment.

Referring to FIG. 1, a flow chart of the mark segmentation method according to one embodiment is shown. The mark segmentation method is further schematically illustrated in FIGS. 2-4 according to various embodiments.

First, in step S102, a plurality of segments formed on a substrate are identified by a processor. The segments each have a width $W_S$ and are separated from each other by a space $S_S$. In some cases, the processor may be a processor of a lithographic apparatus. In some cases, the substrate may be a wafer, a silicon substrate or the like, and optionally comprise layer(s) formed thereof, such as a buried oxide layer, a poly-Si layer, a dielectric layer, an anti-reflective coating (ARC), a photo resist layer, a hard mask layer, a metal layer and the like. In some cases, the segments may be raised, such as raised lines fabricated from the material of any optional layer mentioned above, or the segments may be recessed, such as trenches formed in one said optional layer. In some cases, the processor may define the segments comprising multiple dot-like features, such as bumps or holes. At this time, the processor may define the width $W_S$ of the segments being across a plurality of the dot-like features, particularly from an edge of one dot-like feature to an edge of another dot-like feature.

Then, in step S104, a plurality of marks are set over the segments by the processor. Here, the marks may not be physically formed, while merely be defined by the processor. Step 104 comprises: (1) adjusting a width $W_M$ of each mark being equal to $m(W_S+S_S)+W_S$ or $m(W_S+S_S)+S_S$ by the processor, m being an integer; and (2) adjusting a space $S_M$ of adjacent two of the marks by the processor such that $W_M+S_M=n(W_S+S_S)$, n being an integer. In some cases, step (1) and (2) may be repeated. In some cases, especially in the cases that $W_S$ and $S_S$ are nano-scaled, in order to align more accurately, the n value may be very large, even up to 1000. While generally, n may be in a range from 5 to 100, particularly from 10 to 100.

In the past, the relations between $W_M$, $S_M$ and $W_S$, $S_S$ as described herein are not specially defined in a mark segmentation method. As such, an edge of the marks may not be aligned with an edge of the segments. As the reduction of the semiconductor structure sizes, the marks are likely to shift, thereby the layered structures may not be aligned with each other, or the corresponding elements of the semiconductor structures are shifted in one layered structure. While in the mark segmentation method according to this embodiment, since $W_M$ must equal to $m(W_S+S_S)+W_S$ or $m(W_S+S_S)+S_S$, and $W_M+S_M$ must equal to $n(W_S+S_S)$, the shift condition is less likely to occur even though that $W_S$ and $S_S$ are very small.

In some cases, step S104 may further comprise masking the segments that are located in the spaces of the marks by the processor. Alternatively, there is no segment disposed in the spaces of the marks. In some cases, the processor may optionally define the marks as alignment marks for the proceeding of an alignment step.

Figure 2:
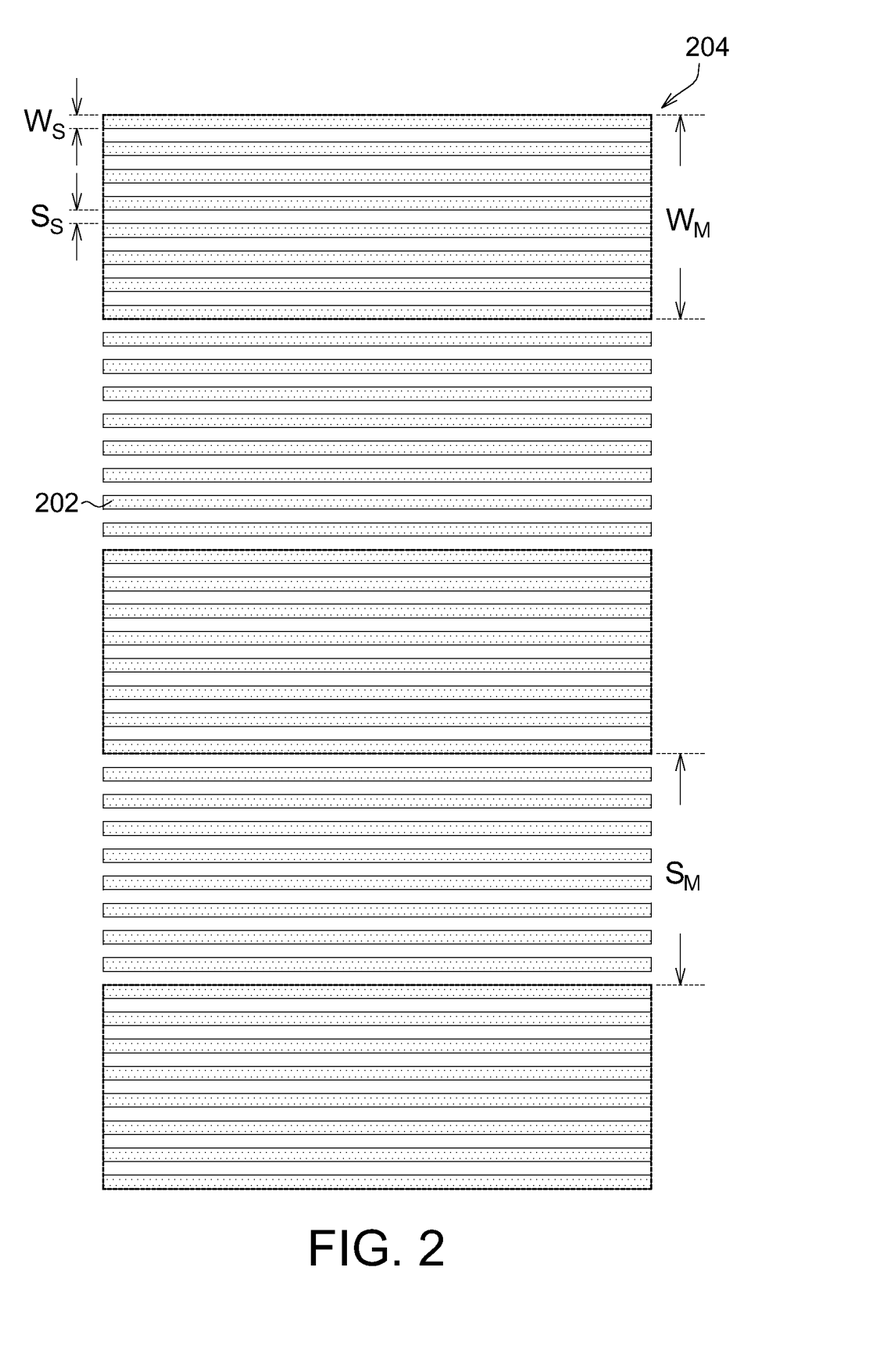
FIG. 2 schematically shows the mark segmentation method according to one embodiment.
Figure 3:
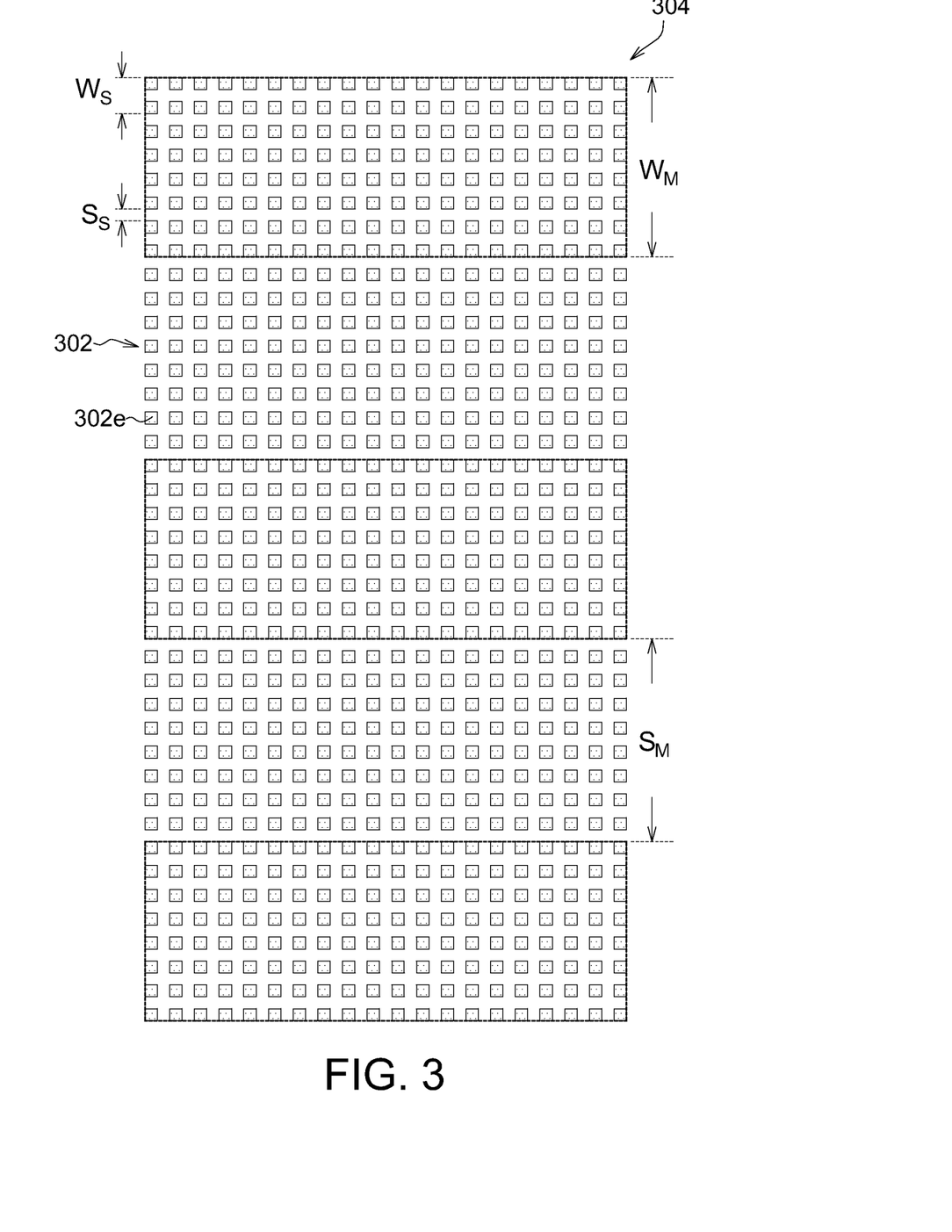
FIG. 3 schematically shows the mark segmentation method according to another embodiment.
Figure 4:
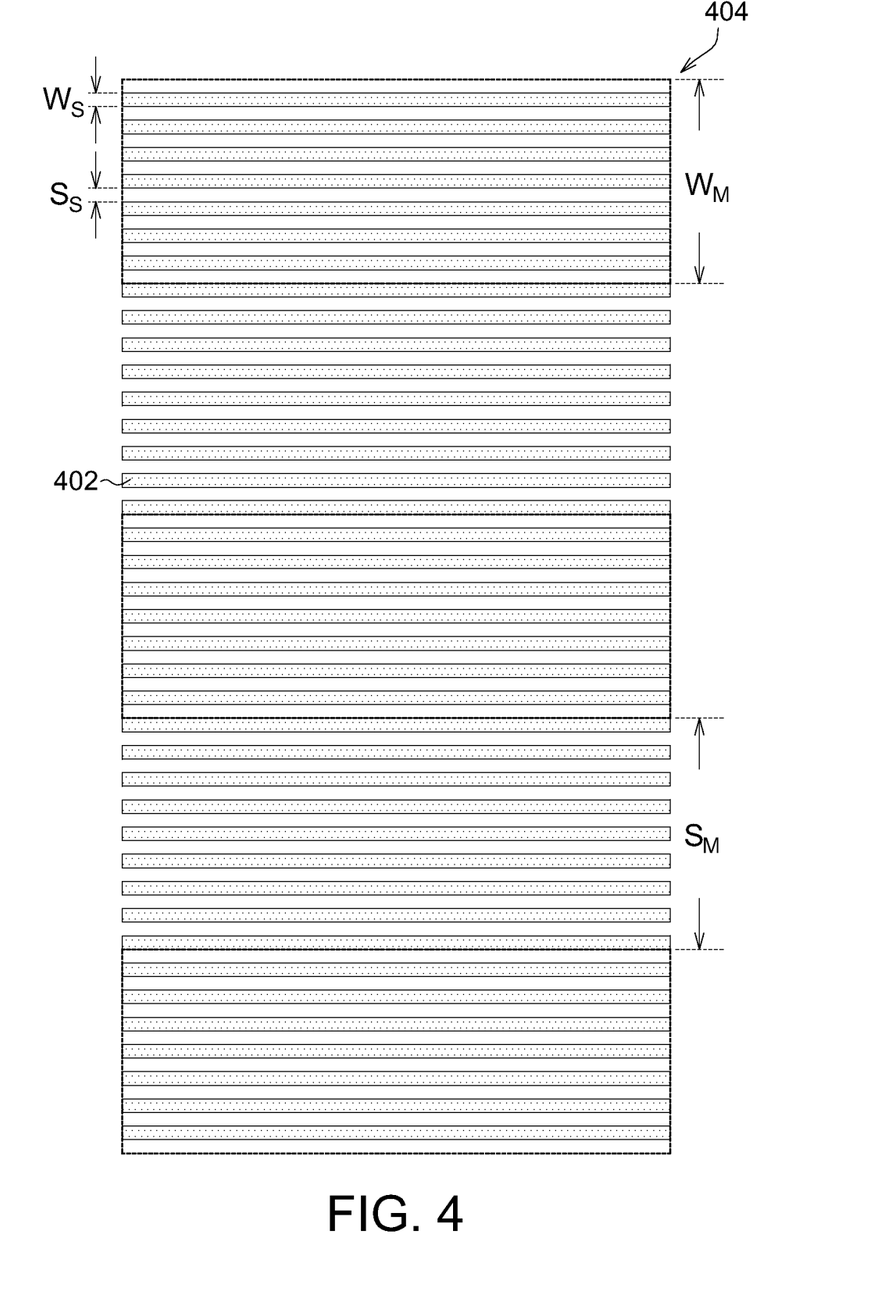
FIG. 4 schematically shows the mark segmentation method according to still another embodiment.

FIG. 2 schematically shows the mark segmentation method according to one embodiment. In the embodiment of FIG. 2, segments 202 and marks 204 have the relation that $W_M$ equals to $m(W_S+S_S)+W_S$, m being 7 for example. FIG. 3 schematically shows the mark segmentation method according to another embodiment. Segments 302 constitutes of a plurality of dot-like features 302e, and the width $W_S$ of the segments 302 is across from an edge of one row of the dot-like features 302e to an edge of another row of the dot-like features 302e. In the embodiment of FIG. 3, the segments 302 and marks 304 have the relation that $W_M$ equals to $m(W_S+S_S)+W_S$, m being 3 for example. FIG. 4 schematically shows the mark segmentation method according to still another embodiment. In the embodiment of FIG. 4, segments 402 and marks 404 have the relation that $W_M$ equals to $m(W_S+S_S)+S_S$, m being 7 for example.

Now the disclosure is directed to the method for manufacturing a semiconductor structure applying said mark segmentation method. For explanation convenience, the sidewall image transfer (SIT) technique is exemplarily described in the following content. However, the embodiments are not limited thereto, any approaches known in the art may be applied to form segments on a substrate. Further, a non-conflicting feature described in one embodiment may replace a feature described in another embodiment or be added to another embodiment.

Referring to FIGS. 5A-5G, the method for manufacturing a semiconductor structure according to one embodiment is shown. In this embodiment, the segments are formed as raised lines by SIT technique.

Figure 5A:
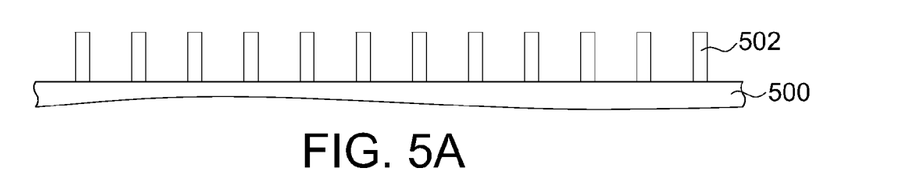
FIGS. 5A-5G schematically shows the method for manufacturing a semiconductor structure according to one embodiment.

First, as shown in FIG. 5A, a plurality of placeholders 502 are formed on a substrate 500. In some cases, this step may comprise forming a temporary layer on the substrate 500 and removing parts of the temporary layer so as to form the placeholders 502. The material of the temporary layer may comprise, for example, silicon nitride, silicon oxide, poly-Si, organic material, amorphous carbon, ARC material, inorganic material and the like.

Figure 5B:
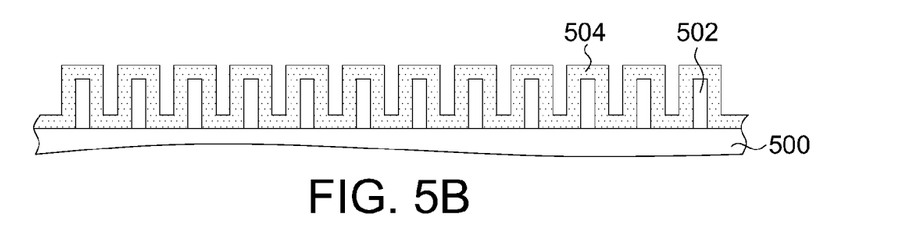

Then, as shown in FIG. 5B, a spacer material 504 is formed conformally covering the placeholders 502. In some cases, the spacer material 504 may comprise, for example, silicon oxide, silicon nitride, silicon oxynitride or the like.

Figure 5C:
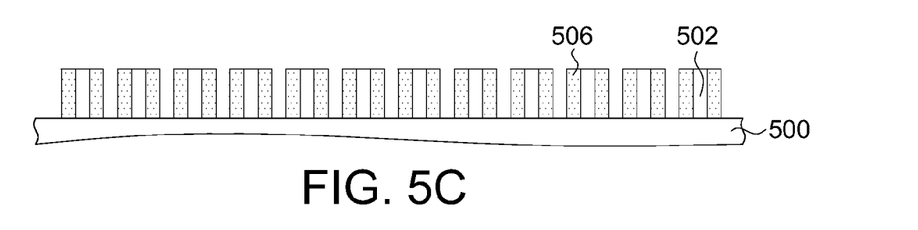
Figure 5D:
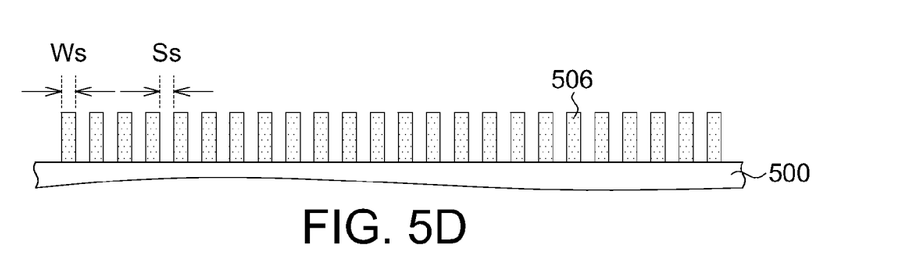

As shown in FIG. 5C, the parts of the spacer material 504 formed above the placeholders 502 are removed. Beside, as shown in FIG. 5D, the placeholders 502 are removed, so as to form a plurality of segments 506 on the substrate 500. In some cases, the steps illustrated in FIGS. 5C and 5D may be conducted by chemical mechanical polishing, etching, etc. All of the segments 506 each have a width $W_S$, and are separated from each other by a space $S_S$. Here, the segments 506 separated by the space $S_S$ are formed successively on the substrate 500.

Figure 5E:
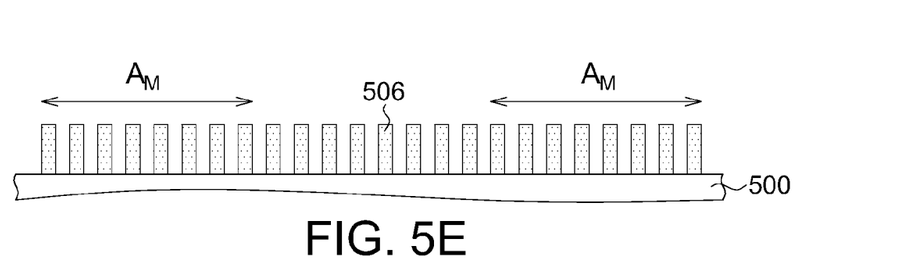

Thereafter, as shown in FIG. 5E, a plurality of marks are set over the segments 506 by a processor (not shown). Here, the marks may merely be defined by the processor without physical bodies. The processor defines the areas $A_M$ of the marks. The marks each have a width $W_M$ (while not particularly indicated, in FIG. 5E, the widths of $A_M$ on the paper being $W_M$), and are separated from each other by a space $S_M$ (not shown in FIG. 5E). In this embodiment, $W_M$ equals to $m(W_S+S_S)+W_S$, and $W_M+S_M$ equals to $n(W_S+S_S)$, wherein m and n are integers. While m is exemplarily equals to 7, m may be other values, such as an even number. The value of n is in a range from 5 to 100, particularly from 10 to 100. In another embodiment, $W_M$ may equal to $m(W_S+S_S)+S_S$, and $W_M+S_M$ equals to $n(W_S+S_S)$, wherein m and n are integers.

Figure 5F:
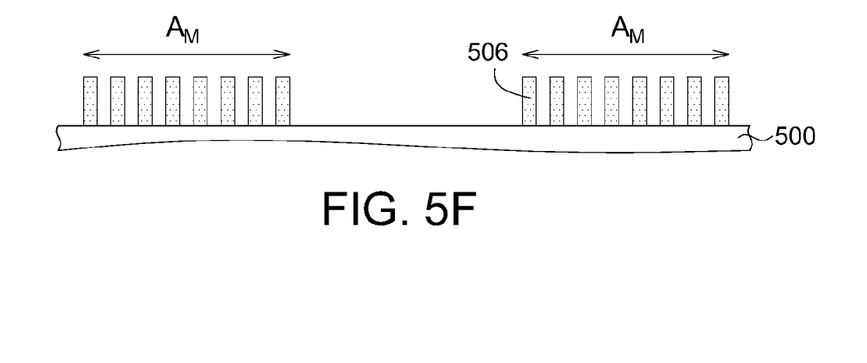

After setting the marks, the manufacturing method according to this embodiment may optionally comprise a step of removing the segments 506 that are located in the spaces of the marks, as shown in FIG. 5F. Alternatively, the manufacturing method according to this embodiment may optionally comprise a step of masking the segments that are located in the spaces of the marks by the processor, as illustrated in the top view of FIG. 5F'.

Figure 5G:
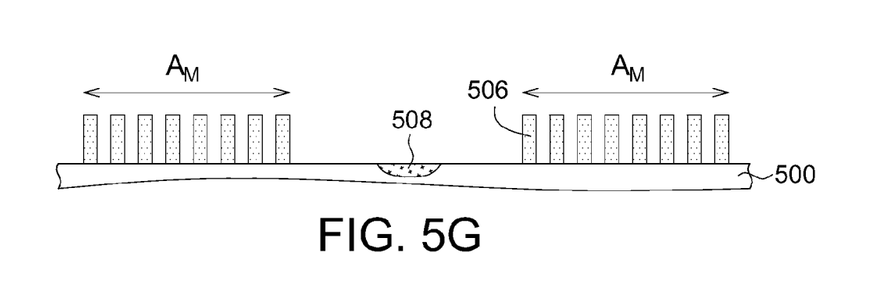

As shown in FIG. 5G, after setting the marks, a layered structure 508 may be formed on the substrate 500 with an alignment step using the marks. In the disclosure and the claims, the term "layered structure" is intended to embrace a layer of the semiconductor structure, a temporary layer existing during the process of the semiconductor structure, even an opening and the like, without limitation to its configuration and arrangement. In FIG. 5G, the layered structure 508 is exemplarily shown as a layer formed in the substrate 500. In some cases, the layered structure 508 may be a doped layer.

Referring to FIGS. 6A-6I, the method for manufacturing a semiconductor structure according to another embodiment is shown. In this embodiment, the segments are formed as trenches by SIT technique. The formation, materials, configuration and arrangement of the substrate 600, the placeholders 602, the spacer material 604 and the spacers 606 are similar to those of the substrate 500, the placeholders 502, the spacer material 504 and the segments 506, respectively. The related description is omitted herein.

Figure 6A:
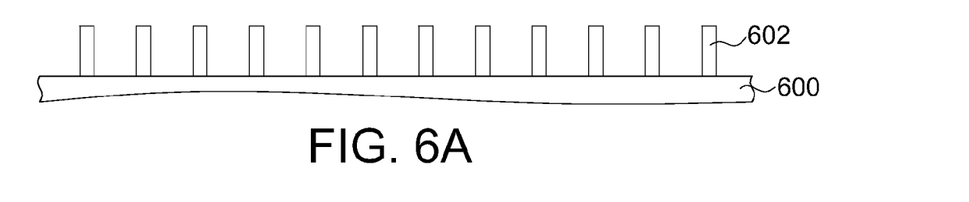
FIGS. 6A-6I schematically shows the method for manufacturing a semiconductor structure according to another embodiment.
Figure 6B:
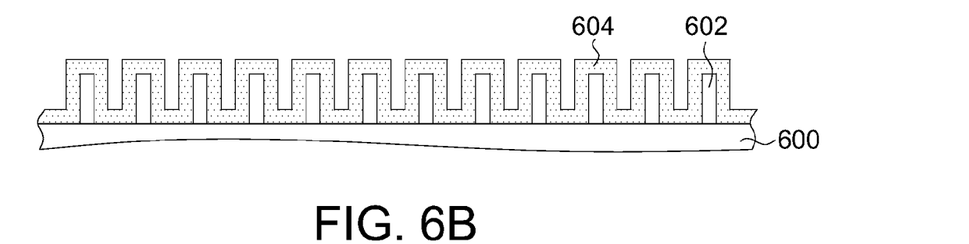
Figure 6C:
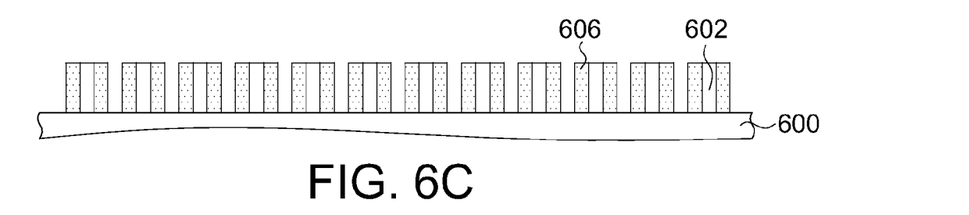
Figure 6D:
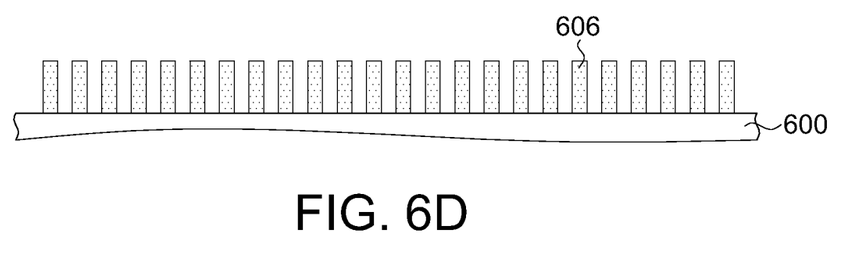
Figure 6E:
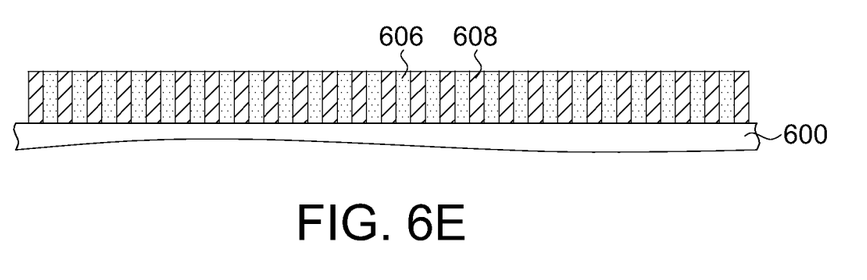
Figure 6F:
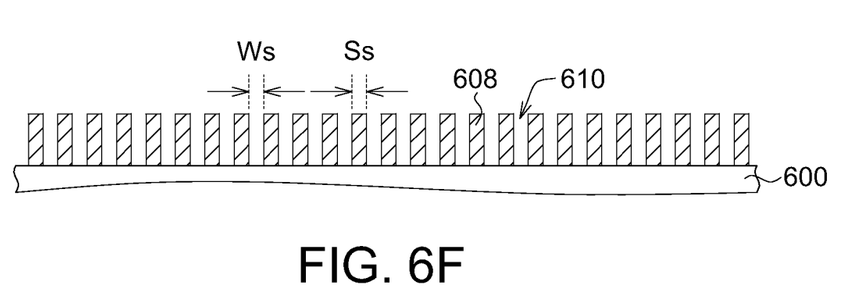

Referring to FIG. 6E, another spacer material 608 is formed between and beside the spacers 606. The spacer material 608 and the spacer material 604 are different. As such, the spacers 606 may be selectively removed by etching, etc., so as to formed the trenches used as segments 610, as shown in FIG. 6F.

Figure 6G:
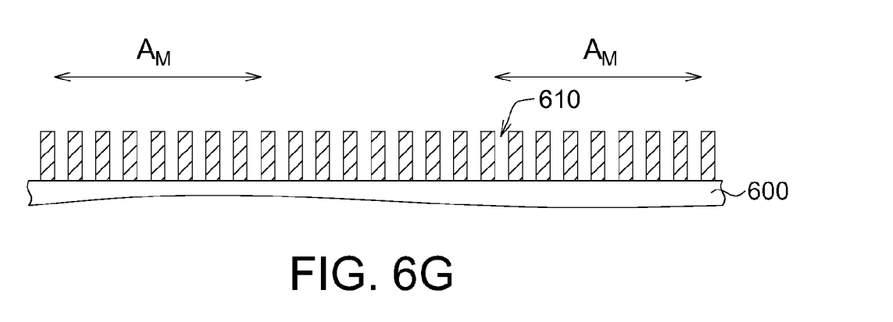

Thereafter, as shown in FIG. 6G, a plurality of marks are set over the segments 610 by a processor (not shown). Here, the marks may merely be defined by the processor without physical bodies. The processor defines the areas $A_M$ of the marks. The marks each have a width $W_M$ (while not particularly indicated, in FIG. 6G, the widths of $A_M$ on the paper being $W_M$), and are separated from each other by a space $S_M$ (not shown in FIG. 6G). In this embodiment, $W_M$ equals to $m(W_S+S_S)+S_S$, and $W_M+S_M$ equals to $n(W_S+S_S)$, wherein m and n are integers. While m is exemplarily equals to 7, m may be other values, such as an even number. The value of n is in a range from 5 to 100, particularly from 10 to 100. In another embodiment, $W_M$ may equal to $m(W_S+S_S)+W_S$, and $W_M+S_M$ equals to $n(W_S+S_S)$, wherein m and n are integers.

Figure 6H:
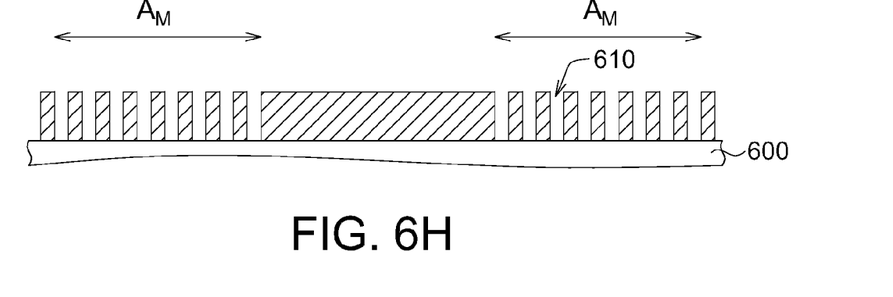

As shown in FIG. 6H, after setting the marks, the manufacturing method according to this embodiment may optionally comprise a step of removing the segments 610 that are located in the spaces of the marks. The "removing" step may be carried out by filling a material into the segments 610 (i.e., trenches) to be removed.

Figure 6I:
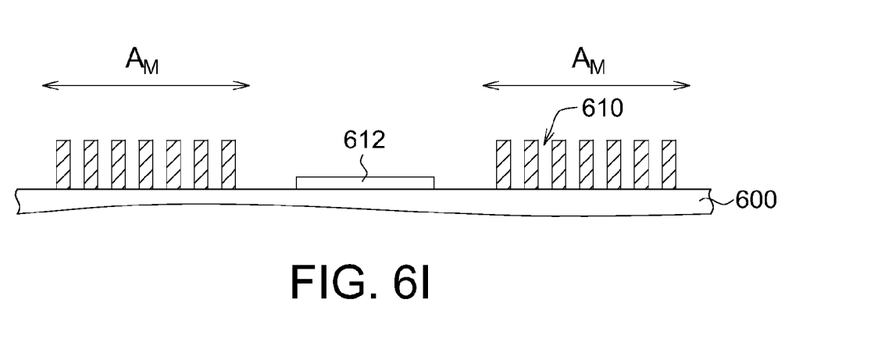

As shown in FIG. 6I, after setting the marks, a layered structure 612 may be formed on the substrate 600 with an alignment step using the marks. In FIG. 6I, the layered structure 612 is exemplarily shown raised from the substrate 600. In some cases, the layered structure 612 may be a buried oxide layer, a poly-Si layer, a dielectric layer, an ARC layer, a photo resist layer, a hard mask layer, a metal layer or the like.

Referring to FIGS. 7A-7F, the method for manufacturing a semiconductor structure according to still another embodiment is shown. In this embodiment, the segments are formed as raised lines by SIT technique. This embodiment is different from the embodiment of FIGS. 5A-5G in that the values of $W_S$, $S_S$, $W_M$ and $S_M$ are pre-determined, and the segments are formed only in the areas $A_M$ where the marks to be set. The formation and materials of the substrate 700, the placeholders 702, the spacer material 704 and the segments 706 are similar to those of the substrate 500, the placeholders 502, the spacer material 504 and the segments 506, respectively. The related description is omitted herein.

Figure 7A:
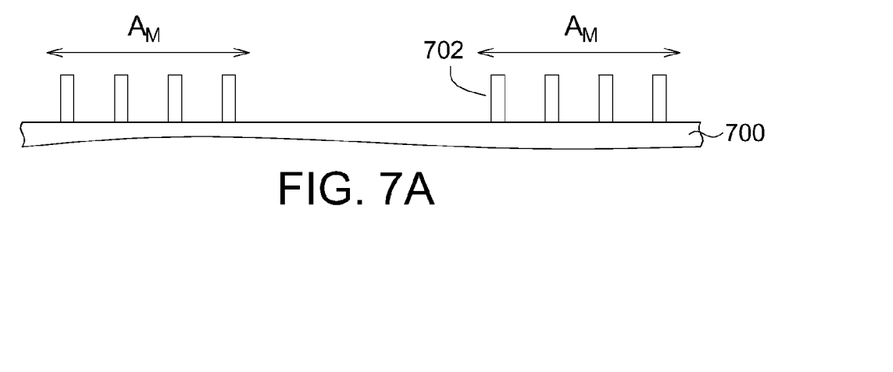
FIGS. 7A-7F schematically shows the method for manufacturing a semiconductor structure according to still another embodiment.
Figure 7B:
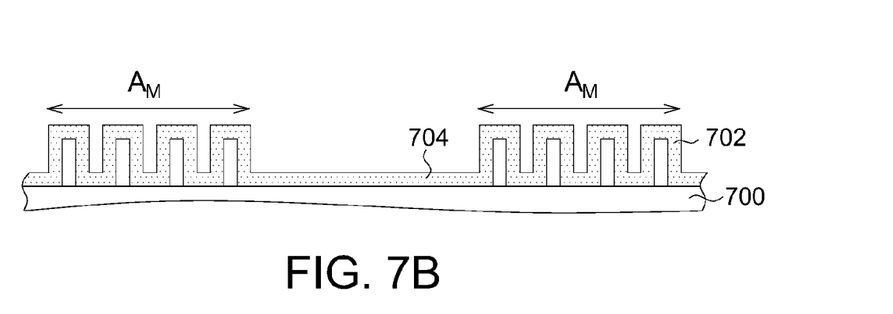
Figure 7C:
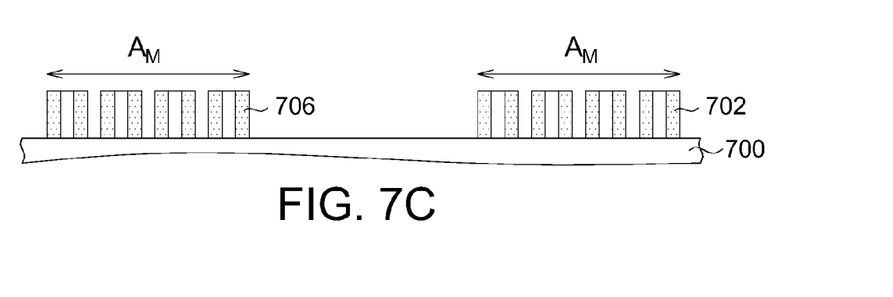
Figure 7D:
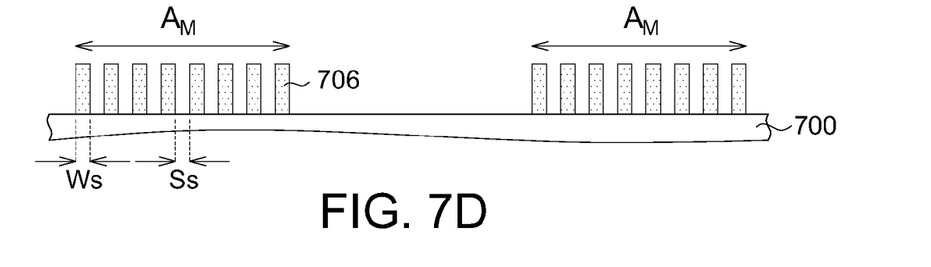
Figure 7E:
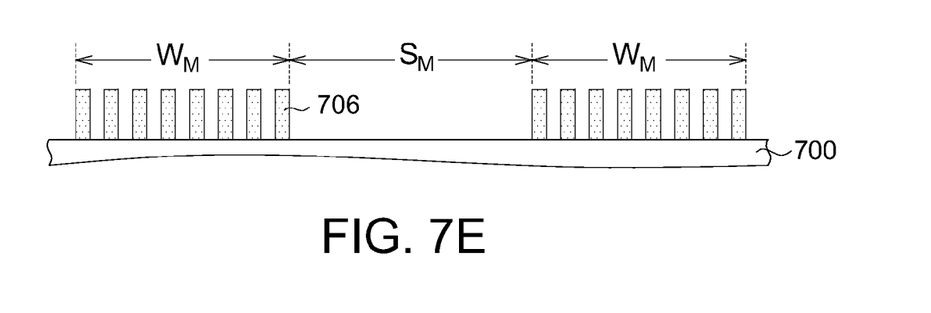

Thereafter, as shown in FIG. 7E, a plurality of marks are set over the segments 706 by a processor (not shown). Here, the marks may merely be defined by the processor without physical bodies. The processor defines the areas $A_M$ of the marks. The marks each have a width $W_M$, and are separated from each other by a space $S_M$. In this embodiment, $W_M$ equals to $m(W_S+S_S)+W_S$, and $W_M+S_M$ equals to $n(W_S+S_S)$, wherein m and n are integers. In this embodiment, due to the segments 706 are directly formed in the areas $A_M$ by SIT technique, it will be easier for manufacturing process that even numbered segments 706 being formed in one mark area $A_M$. At this time, m is an odd number. The value of n is in a range from 5 to 100, particularly from 10 to 100.

Figure 7F:
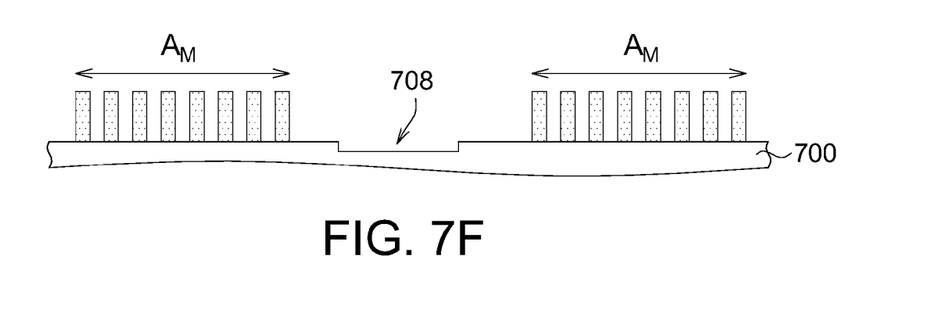

As shown in FIG. 7F after setting the marks, a layered structure 708 may be formed on the substrate 700 with an alignment step using the marks. In FIG. 7F, the layered structure 708 is a recess into the substrate 700.

In the method for manufacturing a semiconductor structure according to the embodiments described above, since $W_M$ must equal to $m(W_S+S_S)+W_S$ or $m(W_S+S_S)+S_S$, and $W_M+S_M$ must equal to $n(W_S+S_S)$, the marks are aligned with the segments. As such, even $W_S$ and $S_S$ are very small, the layered structures are able to aligned with each other, and the corresponding elements of the semiconductor structures formed in one layered structure will not shift.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A mark segmentation method, comprising:
    identifying a plurality of segments having a width $W_S$ and separated from each other by a space $S_S$ formed by a processor; and
    setting a plurality of marks over the segments by the processor, comprising:
        step (1): adjusting a width $W_M$ of each one of the marks being equal to $m(W_S+S_S)+W_S$ or $m(W_S+S_S)+S_S$ by the processor, wherein m is an integer; and
        step (2): adjusting a space $S_M$ of adjacent two of the marks by the processor such that $W_M+S_M=n(W_S+S_S)$, wherein n is an integer;
        wherein the step (1) and the step (2) are repeated.

2. The mark segmentation method according to claim 1, wherein in the step of identifying the segments, the processor defines the segments comprising at least ones selected from the group consisting of lines, bumps, trenches and holes.

3. The mark segmentation method according to claim 2, wherein in the step of identifying the segments, the processor defines the width $W_S$ of the segments being across a plurality of the bumps or the holes.

4. The mark segmentation method according to claim 3, wherein the processor defines the width $W_S$ of the segments being across from an edge of one of the bumps/holes to an edge of another one of the bumps/holes.

5. The mark segmentation method according to claim 1, wherein the step of setting the marks further comprises:
    masking ones of the segments located in the spaces of the marks by the processor.

6. The mark segmentation method according to claim 1, wherein in the step of setting the marks, no segment is disposed in the spaces of the marks.

7. The mark segmentation method according to claim 1, further comprising:
    defining the marks as alignment marks by the processor.

8. The mark segmentation method according to claim 1, wherein n is in a range from 10 to 100.

9. A method for manufacturing a semiconductor structure, comprising:
    forming a plurality of segments having a width $W_S$ and separated from each other by a space $S_S$ on a substrate, wherein the segments separated by the space $S_S$ are formed successively on the substrate;
    setting a plurality of marks having a width $W_M$ and separated from each other by a space $S_M$ over the segments by a processor, wherein
        $W_M=m(W_S+S_S)+W_S$ or $W_M=m(W_S+S_S)+S_S$, m is an integer, and
        $W_M+S_M=n(W_S+S_S)$, n is an integer; and
    after setting the marks, removing ones of the segments located in the spaces of the marks.

10. The method according to claim 9, wherein the segments comprise at least ones selected from the group consisting of lines, bumps, trenches and holes.

11. The method according to claim 10, wherein the width $W_S$ of the segments is across a plurality of the bumps or the holes.

12. The method according to claim 11, wherein the width $W_S$ of the segments is across from an edge of one of the bumps/holes to an edge of another one of the bumps/holes.

13. The method according to claim 9, wherein the marks are alignment marks.

14. The method according to claim 9, wherein the step of setting the marks further comprises:
    masking ones of the segments located in the spaces of the marks by the processor.

15. The method according to claim 9, wherein the step of forming the segments comprises:
    forming a temporary layer on the substrate;
    removing parts of the temporary layer to form a plurality of placeholders;
    forming a spacer material conformally covering the placeholders; and
    removing parts of the spacer material formed above the placeholders and removing the placeholders so as to form the segments.

16. The method according to claim 9, wherein the step of forming the segments comprises:
    forming a temporary layer on the substrate;
    removing parts of the temporary layer to form a plurality of placeholders;
    forming a spacer material conformally covering the placeholders;
    removing parts of the spacer material formed above the placeholders and removing the placeholders so as to form a plurality of spacers;
    forming another spacer material between and beside the spacers; and
    removing the spacers to form the segments.

17. The method according to claim 9, wherein n is in a range from 10 to 100.

18. A method for manufacturing a semiconductor structure, comprising:
forming a plurality of segments having a width $W_S$ and separated from each other by a space $S_S$ on a substrate; and
setting a plurality of marks having a width $W_M$ and separated from each other b a space S over the segments by a processor wherein
$W_M = m(W_S+S_S)+W_S$ or $W_M = m(W_S+S_S)+S_S$, m is an integer, and
$W_M+S_M = n(W_S+S_S)$, n is an integer;
wherein before forming the segments, determine the values of $W_S$, $S_S$, $W_M$ and $S_M$, and the segments are formed only in the areas where the marks to be set.

\* \* \* \* \*